(12) United States Patent
Chang et al.

(10) Patent No.: US 11,340,301 B2
(45) Date of Patent: May 24, 2022

(54) APPARATUS AND METHOD FOR DIAGNOSING CURRENT SENSOR

(71) Applicant: LG Chem, Ltd., Seoul (KR)

(72) Inventors: Ho-Yun Chang, Daejeon (KR); Sang-Jin Lee, Daejeon (KR)

(73) Assignee: LG Energy Solution, Ltd.

(*) Notice: Subject to any disclaimer, the term of this patent is extended or adjusted under 35 U.S.C. 154(b) by 36 days.

(21) Appl. No.: 16/964,272

(22) PCT Filed: Jun. 28, 2019

(86) PCT No.: PCT/KR2019/007915
§ 371 (c)(1),
(2) Date: Jul. 23, 2020

(87) PCT Pub. No.: WO2020/005025
PCT Pub. Date: Jan. 2, 2020

(65) Prior Publication Data
US 2021/0033679 A1  Feb. 4, 2021

(30) Foreign Application Priority Data

Jun. 28, 2018  (KR) .................. 10-2018-0074998

(51) Int. Cl.
*G01R 31/3842* (2019.01)
*G01R 31/367* (2019.01)
(Continued)

(52) U.S. Cl.
CPC ......... *G01R 31/3842* (2019.01); *G01K 13/00* (2013.01); *G01R 31/367* (2019.01); *G01R 31/374* (2019.01)

(58) Field of Classification Search
None
See application file for complete search history.

(56) References Cited

U.S. PATENT DOCUMENTS

2009/0108812 A1   4/2009  Lee
2011/0037476 A1   2/2011  Jung et al.
(Continued)

FOREIGN PATENT DOCUMENTS

JP  2002246074 A  8/2002
JP  2003068366 A  3/2003
(Continued)

OTHER PUBLICATIONS

International Search Report for Application No. PCT/KR2019/007915 dated Oct. 23, 2019, 2 pages.
(Continued)

*Primary Examiner* — Jas A Sanghera
(74) *Attorney, Agent, or Firm* — Lerner, David, Littenberg, Krumholz & Mentlik, LLP (57) ABSTRACT

An apparatus and method for diagnosing whether a current sensor provided to a battery pack is normal. The apparatus includes: a voltage measuring unit configured to measure a both-end voltage of the cell assembly; a current measuring unit configured to measure a current flowing through the charging and discharging path; and a processor configured to diagnose the current sensor based on a change value of a voltage-based charged charge amount and a change value of a current-based charged charge amount.

13 Claims, 5 Drawing Sheets

(51) Int. Cl.
*G01R 31/374* (2019.01)
*G01K 13/00* (2021.01)

(56) References Cited

U.S. PATENT DOCUMENTS

| | | | |
|---|---|---|---|
| 2015/0066262 A1* | 3/2015 | Chang | B60L 58/21 |
| | | | 701/22 |
| 2015/0316636 A1 | 11/2015 | Nishijima et al. | |
| 2016/0349329 A1 | 12/2016 | Wada et al. | |

FOREIGN PATENT DOCUMENTS

| | | | |
|---|---|---|---|
| JP | 2004251744 | A | 9/2004 |
| JP | 2007335352 | A | 12/2007 |
| JP | 2010200574 | A | 9/2010 |
| JP | 2010252594 | A | 11/2010 |
| JP | 2010286445 | A | 12/2010 |
| KR | 101249347 | B1 | 4/2013 |
| KR | 20130137389 | A | 12/2013 |
| KR | 101511275 | B1 | 4/2015 |
| KR | 20160111166 | A | 9/2016 |

OTHER PUBLICATIONS

Plett, "Extended Kalman filtering for battery management systems of LiPB-based HEV battery packs, Part 1. Background," Journal of Power Sources, Jun. 9, 2004, pp. 252-261, vol. 134.

Plett, "Extended Kalman filtering for battery management systems of LiPB-based HEV battery packs, Part 2. Modeling and Identification," Journal of Power Sources, May 28, 2004, pp. 262-276, vol. 134.

Plett, "Extended Kalman filtering for battery management systems of LiPB-based HEV battery packs, Part 3. State and parameter estimation," Journal of Power Sources, May 28, 2004, pp. 277-292, vol. 134.

Extended European Search Report including Written Opinion for Application No. 19825793.3 dated Mar. 23, 2021, 8 pages.

* cited by examiner

|   | VOLTAGE | CHARGED CHARGE AMOUNT |
|---|---|---|
| ... | 3.1 | 0Ah |
| a | 3.2 | 10Ah |
| ... | ... | ... |
| b | 4.0 | 40Ah |

FIG. 5

APPARATUS AND METHOD FOR DIAGNOSING CURRENT SENSOR

CROSS-REFERENCE TO RELATED APPLICATIONS

The present application is a national phase entry under 35 U.S.C. § 371 of International Application No. PCT/KR2019/007915 filed Jun. 28, 2019, published in Korean, which claims priority from Korean Patent Application No. 10-2018-0074998 filed Jun. 28, 2018, all of which are incorporated herein by reference.

TECHNICAL FIELD

The present application claims priority to Korean Patent Application No. 10-2018-0074998 filed on Jun. 28, 2018 in the Republic of Korea, the disclosures of which are incorporated herein by reference.

The present disclosure relates to an apparatus and method for diagnosing a current sensor, and more particularly, to an apparatus and method for diagnosing a current sensor, which may effectively diagnose whether a current sensor provided to a battery pack is normal.

BACKGROUND ART

In recent years, the demand for portable electronic products such as notebook computers, video cameras and portable phones has increased sharply, and also energy storage batteries, robots and satellites has been active developed. Accordingly, high-performance secondary batteries allowing repeated charging and discharging are being actively studied.

Accordingly, as the technology development and demand for mobile devices, electric vehicles, hybrid electric vehicles, power storage devices, and uninterruptible power supplies increase, the demand for secondary batteries as energy sources is rapidly increasing. In particular, the secondary batteries used in electric vehicles or hybrid electric vehicles are high-power, high-capacity secondary batteries, and many studies are being conducted thereon.

In addition, along with the demand for secondary batteries, research on peripheral components and devices related to the secondary batteries is being conducted. That is, research is being conducted on various components and devices such as a cell assembly prepared by connecting a plurality of secondary batteries into a single module, a battery management system (BMS) for controlling the charging and discharging of the cell assembly and monitoring a state of each secondary battery, a battery pack prepared by integrating the cell assembly and the BMS into a pack, and a current sensor for measuring a charging and discharging current flowing through the cell assembly.

In particular, the current sensor is provided on a charging and discharging path to measure a charging and discharging current, and a lot of researches are being conducted thereon. For the current sensor, it is important to transmit an accurate measured current value to the BMS in order to prevent overcharging or overdischarging of the battery. In addition, in order for the BMS to estimate a state of charge (SOC) or a state of health (SOH) of the battery and to perform an effective cell balancing operation, the current sensor must transmit accurate measured current values to the BMS.

The accuracy of the current sensor is difficult to diagnose. Thus, in the related art, there is a need for a technology capable of diagnosing the accuracy of the current sensor. However, this requirement has a problem of increasing the complexity of a diagnosing circuit.

SUMMARY

Technical Problem

The present disclosure is designed to solve the problems of the related art, and therefore the present disclosure is directed to providing an improved apparatus and method for diagnosing a current sensor, which may effectively diagnose where a current sensor provided to a battery pack is normal, based on an error between a change value of a voltage-based SOC and a change value of a current-based SOC.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided an apparatus for diagnosing a current sensor provided on a charging and discharging path for supplying a charging and discharging current to a cell assembly, the apparatus comprising: a voltage measuring unit electrically connected to the cell assembly to measure a voltage across both ends of the cell assembly; a current measuring unit electrically connected to the current sensor to receive an electric signal from the current sensor and measure a current flowing through the charging and discharging path based on the electric signal; and a processor configured to calculate a voltage-based amount of change in charge to the cell assembly based on the measured voltage at each of at least two preset reference times by the voltage measuring unit, calculate a current-based amount of change in charge to the cell assembly based on the measured current at the at least two preset reference times by the current measuring unit, and diagnose the current sensor based on the voltage-based amount of change in charge to the cell assembly and the current-based amount of change in charge to the cell assembly.

The processor may be configured to compare the voltage-based amount of change in charge to the cell assembly and the current-based amount of change in charge to the cell assembly, and diagnose that the current sensor is in a normal state when a difference between the voltage-based amount of change in charge to the cell assembly and the current-based amount of change in charge to the cell assembly is within a normal range.

The apparatus for diagnosing a current sensor according to another embodiment to the present disclosure may further comprise a temperature measuring unit electrically connected to the cell assembly and configured to measure a temperature of the cell assembly at each of the at least two preset reference times.

The processor may be configured to calculate the voltage-based amount of change in charge to the cell assembly based on the measured voltage and the temperature measured at each of the at least two preset reference times by the temperature measuring unit and change the normal range according to a difference between the measured temperatures of the cell assembly measured at each of the at least two preset reference times.

The at least two preset reference times may include a charging initiation time and a charging completion time.

The processor may be configured to calculate the voltage-based amount of change in charge to the cell assembly by comparing a first amount of charge in the cell assembly corresponding to the measured voltage of the cell assembly at the charging initiation time to a second amount of charge in the cell assembly corresponding to a measured voltage of the cell assembly at the charging completion time.

The processor may be configured to calculate the current-based amount of change in charge to the cell assembly by accumulating the measured current of the cell assembly from the charging initiation time to the charging completion time.

The apparatus for diagnosing a current sensor according to another embodiment to the present disclosure may further comprise a memory device configured to store a look-up table, which predefines an amount of charge to the cell assembly corresponding to either (i) the voltage across both ends of the cell assembly or (ii) a combination of both the voltage across both ends of the cell assembly and a temperature of the cell assembly.

In another aspect of the present disclosure, there is also provided a battery management system (BMS), comprising the apparatus for diagnosing a current sensor according to any of the embodiments of the present disclosure.

In another aspect of the present disclosure, there is also provided a battery pack, comprising the apparatus for diagnosing a current sensor according to any of the embodiments of the present disclosure.

In another aspect of the present disclosure, there is also provided a method for diagnosing a current sensor provided on a charging and discharging path for supplying a charging and discharging current to a cell assembly, the method comprising: measuring a voltage across both ends of the cell assembly at each of at least two preset reference times; measuring a current flowing through the charging and discharging path, on which the current sensor is provided, during each of the at least two preset reference times; and calculating a voltage-based amount of change in charge to the cell assembly based on the measured voltage of the cell assembly at each of the at least two preset reference times; calculating a current-based amount of change in charge to the cell assembly based on the measured current accumulatively at each of the at least two preset reference times; and diagnosing the current sensor based on the voltage-based amount of change in charge to the cell assembly and the current-based amount of change in charge to the cell assembly.

Diagnosing the current sensor may include comparing the voltage-based amount of change in charge to the cell assembly and the current-based amount of change in charge to the cell assembly, and determining that the current sensor is in a normal state when a difference between the voltage-based amount of change in charge to the cell assembly and the current-based amount of change in charge to the cell assembly is within a normal range.

The method may further include measuring a temperature of the cell assembly at each of the at least two preset reference times.

Diagnosing the current sensor may include calculating the voltage-based amount of change in charge to the cell assembly based on the measured voltage and the measured temperature at each of the at least two preset reference times.

The method may further include changing the normal range according to a difference between the measured temperatures of the cell assembly measured at each of the at least two preset reference times.

The at least two preset reference times may include a charging initiation time and a charging completion time.

Diagnosing the current sensor may include calculating the voltage-based amount of change in charge to the cell assembly by comparing a first amount of charge in the cell assembly corresponding to the measured voltage of the cell assembly at the charging initiation time to a second amount of charge in the cell assembly corresponding to the measured voltage of the cell assembly at the charging completion time.

Diagnosing the current sensor may include calculating the current-based amount of change in charge to the cell assembly by accumulating the measured current of the cell assembly from the charging initiation time to the charging completion time.

Advantageous Effects

According to an aspect of the present disclosure, it is possible to effectively diagnose a current sensor by using a change value of a voltage-based charged charge amount and a change value of a current-based charged charge amount.

In particular, according to an embodiment of the present disclosure, it is possible to provide an improved apparatus and method for diagnosing a current sensor, which may measure the accuracy of the current sensor by calculating the error of the current sensor.

The present disclosure may have various effects other than the above, and other effects of the present disclosure may be understood from the following description and more clearly figured out by the embodiments of the present disclosure.

BRIEF DESCRIPTION OF THE DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

DETAILED DESCRIPTION

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

In addition, in describing the present disclosure, if it is determined that a detailed description of a related known structure or function may obscure the subject matter of the present disclosure, the detailed description thereof will be omitted.

Throughout the specification, when a portion is referred to as "comprising" or "including" any element, it means that the portion may include other elements further, without excluding other elements, unless specifically stated otherwise. Furthermore, the term "processor" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

An apparatus for diagnosing a current sensor according to an embodiment of the present disclosure may be a device for diagnosing a current sensor provided to a battery pack that includes at least one secondary battery. Here, the current sensor may be provided on a charging and discharging path for supplying a charging and discharging current to a cell assembly provided in the battery pack. More specifically, as shown in FIG. 2, the current sensor according to an embodiment of the present disclosure may be provided between a negative electrode terminal of the cell assembly and a negative electrode terminal of the battery pack.

Figure 1:
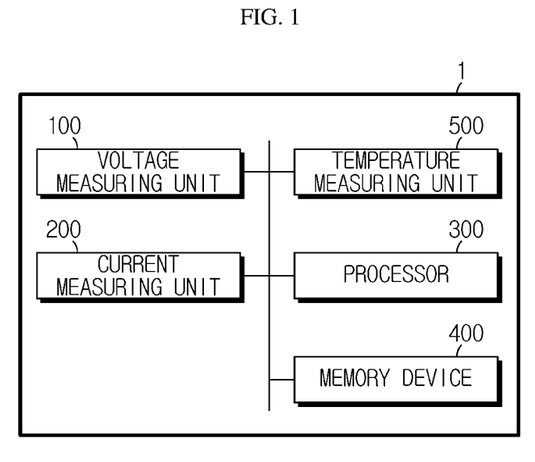
FIG. 1 is a diagram schematically showing a functional configuration of an apparatus for diagnosing a current sensor according to an embodiment of the present disclosure.
Figure 2:
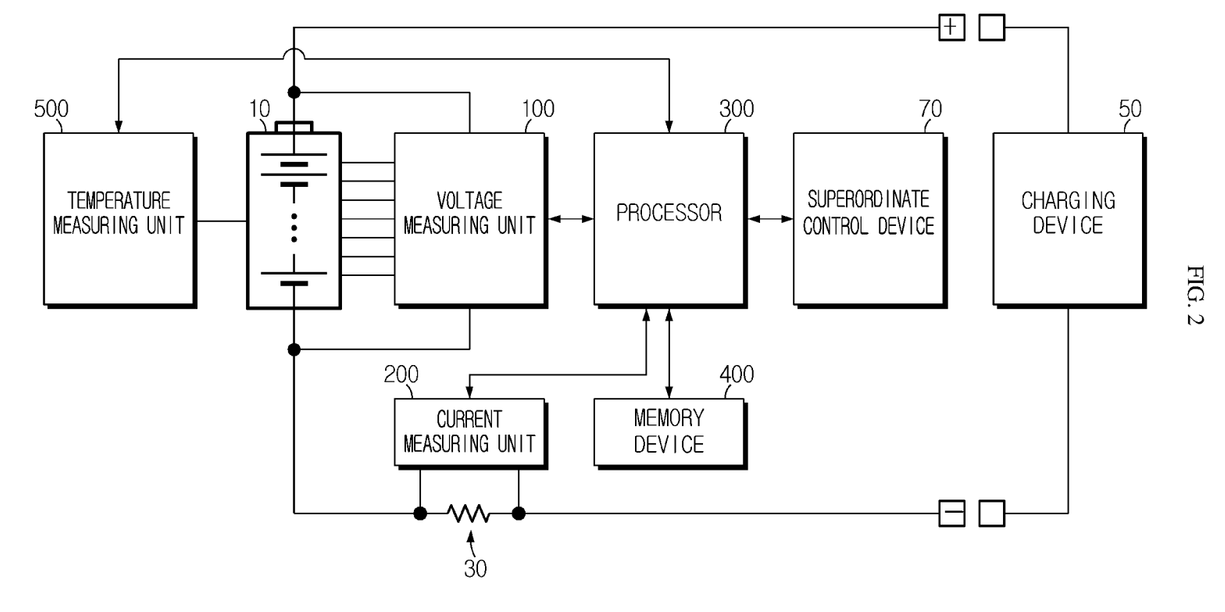
FIG. 2 is a diagram schematically showing that the apparatus for diagnosing a current sensor according to an embodiment of the present disclosure is connected to some components of a battery pack.

FIG. 1 is a diagram schematically showing a functional configuration of an apparatus for diagnosing a current sensor according to an embodiment of the present disclosure, and FIG. 2 is a diagram schematically showing that the apparatus for diagnosing a current sensor according to an embodiment of the present disclosure is connected to some components of a battery pack.

Referring to FIGS. 1 and 2, an apparatus 1 for diagnosing a current sensor according to an embodiment of the present disclosure includes a voltage measuring unit 100, a current measuring unit 200 and a processor 300.

The voltage measuring unit 100 may be electrically connected to the cell assembly 10. For example, as shown in FIG. 2, the voltage measuring unit 100 may be electrically connected to both ends of the cell assembly 10 so as to transmit and receive an electric signal. In addition, the voltage measuring unit 100 may be electrically connected to both ends of each cell provided in the cell assembly 10 so as to transmit and receive an electric signal.

Also, the voltage measuring unit 100 may be configured to measure a both-end voltage of the cell assembly 10. More specifically, the voltage measuring unit 100 may measure the both-end voltage of the cell assembly 10 based on the electric signal received from both ends of the cell assembly 10. In addition, the voltage measuring unit 100 may measure a both-end voltage of each cell based on the electric signal received from both ends of each cell.

Preferably, the voltage measuring unit 100 may be electrically connected to the processor 300 to transmit and receive an electric signal. In addition, the voltage measuring unit 100 may measure a potential difference between a positive electrode terminal of the cell assembly 10 and a negative electrode terminal of the cell assembly 10 at a time interval under the control of the processor 300 and transmit a signal indicating the magnitude of the measured voltage to the processor 300. For example, the voltage measuring unit 100 may be implemented using a voltage measuring circuit generally used in the art.

The current measuring unit 200 may be electrically connected to a current sensor 30 to receive an electric signal from the current sensor 30. In addition, the current measuring unit 200 may be configured to measure a current flowing through a charging and discharging path based on the electric signal received from the current sensor 30.

For example, as shown in FIG. 2, the current measuring unit 200 according to an embodiment of the present disclosure may be electrically connected to both ends of the current sensor 30. Here, one end of the current sensor 30 may be electrically connected to the negative electrode terminal of the cell assembly 10. In addition, the current measuring unit 200 may measure a both-end voltage of the current sensor 30 and measure the current flowing through the charging and discharging path based on the both-end voltage of the current sensor 30. For example, the current measuring unit 200 may measure the current flowing through the charging and discharging path using the Ohm's law.

Preferably, the current measuring unit 200 may be electrically connected to the processor 300 to transmit and receive an electric signal. In addition, the current measuring unit 200 may repeatedly measure the magnitude of a charge current or a discharge current of the current sensor 30 at time intervals under the control of the processor 300 and output a signal indicating the magnitude of the measured current to the processor 300. For example, the current sensor 30 may be implemented using a hall sensor or a sensing resistor generally used in the art. The hall sensor or the sensing resistor may be installed on a line through which the current flows.

The processor 300 may receive the measured voltage from the voltage measuring unit 100. For example, the processor 300 may receive the both-end voltage of the cell assembly 10 from the voltage measuring unit 100.

In addition, the processor 300 may calculate a change value of a voltage-based charged charge amount based on the measured voltages measured at two or more preset reference times. More specifically, the processor 300 may receive the measured voltage with a time difference from the voltage measuring unit 100. Here, the time difference may be a difference between the at least two preset reference times. That is, the reference time may mean at least two different viewpoints. In addition, a period during the reference time may mean a period during the at least two different viewpoints. For example, the reference time may mean t0 and t1, and the period during the reference time may mean the period from t0 to t1.

For example, if the preset reference times are t0 and t1, the processor 300 may receive the measured voltage measured at t0 from the voltage measuring unit 100. In addition, the processor 300 may receive the measured voltage measured at t1 from the voltage measuring unit 100. Also, the processor 300 may calculate the change value of the voltage-based charged charge amount based on a charged charge amount corresponding to the measured voltage measured at t0 and a charged charge amount corresponding to the measured voltage measured at t1. The process of calculating the change value of the voltage-based charged charge amount will be explained later in detail.

In addition, the processor 300 may receive the measured current from the current measuring unit 200. For example, the processor 300 may receive the measured current flowing through the charging and discharging path from the current measuring unit 200.

Also, the processor 300 may calculate a change value of a current-based charged charge amount based on the measured current accumulated during the preset reference time. More specifically, the processor 300 may calculate an accumulated measured current value by integrating the measured current during the reference time based on the measured current received from the current measuring unit 200. Here, the reference time may be set in advance. For example, if the preset reference times are t0 and t1, the processor 300 may receive the measured current measured from t0 to t1 from the current measuring unit 200. In addition, the processor 300 may calculate the change value of the current-based charged charge amount based on a charged charge amount corresponding to the measured current accumulated from t0 to t1. The process of calculating the change value of the current-based charged charge amount will be explained later in detail.

In addition, the processor 300 may be configured to diagnose the current sensor 30 based on the change value of the voltage-based charged charge amount and the change value of the current-based charged charge amount. More specifically, the processor 300 may diagnose that the current sensor 30 is normal if a comparison result between the change value of the voltage-based charged charge amount and the change value of the current-based charged charge amount falls within a normal range. On the contrary, the processor 300 may diagnose that the current sensor 30 is in an abnormal state if the comparison result between the change value of the voltage-based charged charge amount and the change value of the current-based charged charge amount does not fall within the normal range. Here, the normal range is a preset range and may be a reference range with which the processor 300 may diagnose that the current sensor 30 is in a normal state.

Preferably, the apparatus 1 for diagnosing a current sensor according to an embodiment of the present disclosure may further include a temperature measuring unit 500 as shown in FIGS. 1 and 2.

The temperature measuring unit 500 may be electrically connected to the cell assembly 10 to transmit and receive an electric signal. Alternatively, the temperature measuring unit 500 may be mounted to the cell assembly 10 to be electrically connected to the cell assembly 10. Through this configuration, the temperature measuring unit 500 may measure a temperature of the cell assembly 10 and each cell provided in the cell assembly 10.

Preferably, the temperature measuring unit 500 may be electrically coupled to the processor 300 to transmit and receive an electric signal. In addition, the temperature measuring unit 500 may repeatedly measure the temperature of the cell assembly 10 at a time interval and output a signal indicating the magnitude of the measured temperature to the processor 300. For example, the temperature measuring unit 500 may be implemented using a thermocouple generally used in the art.

Preferably, the apparatus 1 for diagnosing a current sensor according to an embodiment of the present disclosure may further include a memory device 400.

The memory device 400 may be electrically connected to the processor 300 to transmit and receive an electric signal. In addition, the memory device 400 may store a look-up table, which defines charged charge amounts corresponding to both-end voltages and/or temperatures of the cell assembly 10, in advance. Preferably, the look-up table stored in the memory device 400 may be a table in which charged charge amounts corresponding to both-end voltages and temperatures of the cell assembly 10 are defined.

For example, the processor 300 according to an embodiment of the present disclosure may estimate a state of charge (SOC) (for example, a charged charge amount) of the cell assembly 10 by using the voltage measurement value, the current measurement value and the temperature measurement value of the cell assembly 10 received from the voltage measuring unit 100, the current measuring unit 200 and the temperature measuring unit 500, and monitor the estimated SOC. That is, the processor 300 may estimate the SOC and monitor the estimated SOC while the cell assembly 10 is charged or discharged, by using the look-up table stored in the memory device 400.

In addition, the processor 300 may estimate the SOC of the cell assembly 10 by integrating the charge current and the discharge current of the cell assembly 10. Here, an initial value of the SOC when the charging or discharging of the cell assembly 10 is initiated may be determined using an open circuit voltage (OCV) of the cell assembly 10 measured before the charging or discharging is initiated. To this end, the processor 300 may estimate the SOC corresponding to the OCV of the cell assembly 10 by using a look-up table that defines SOC at each temperature and each OCV of the cell assembly 10. For example, the look-up table stored in the memory device 400 may be a table in which charged charge amounts corresponding to temperatures and OCVs of the cell assembly 10 are defined.

In another aspect, the processor 300 may estimate the SOC of the cell assembly 10 by using an extended Kalman filter. The extended Kalman filter refers to a mathematical algorithm that adaptively estimates the SOC of the cell assembly 10 using the voltage, current and temperature of the battery cell. Here, the estimation of SOC using the extended Kalman filter may be referenced by, for example, "Extended Kalman filtering for battery management systems of LiPB-based hybrid electric vehicle (HEV) battery packs Parts 1, 2 and 3" (Journal of Power Source 134, 2004, p. 252-261) written by Gregory L. Plett.

The SOC of the cell assembly 10 may also be determined using other known methods capable of estimating the SOC by selectively utilizing voltage, current and temperature of the cell assembly 10, besides the current integration method or the extended Kalman filter described above.

Preferably, the processor 300 according to an embodiment of the present disclosure may compare the change value of the voltage-based charged charge amount and the change value of the current-based charged charge amount, and diagnose that the current sensor 30 is in a normal state if a difference between the change value of the voltage-based charged charge amount and the change value of the current-based charged charge amount is an error falling within the normal range. That is, the processor 300 may diagnose that the current sensor 30 is in a normal state if the difference between the change value of the voltage-based charged charge amount and the change value of the current-based charged charge amount falls within the normal range.

More preferably, the processor 300 according to an embodiment of the present disclosure may measure a measurement error of the current sensor 30 by using the difference between the change value of the voltage-based charged charge amount and the change value of the current-based charged charge amount.

$$\frac{\Delta SOC(V) - \Delta SOC(I)}{\Delta SOC(V)} \times 100 = \varepsilon \qquad \langle \text{Equation 1} \rangle$$

Here, ΔSOC(V) represents the change value [Ah] of the voltage-based charged charge amount, ΔSOC(I) represents the change value [Ah] of the current-based charged charge amount, and ε represents the error rate between the change value of the voltage-based charged charge amount and the change value of the current-based charged charge amount. Here, the unit of ΔSOC(V) and ΔSOC(I) may be [Ah], the unit of ε may be [%].

For example, ΔSOC(V) may be a difference between a voltage-based charged charge amount measured at t1 and a voltage-based charged charge amount measured at t0. ΔSOC(I) may be a current-based charged charge amount accumulated during the period from t0 to t1.

The processor 300 may diagnose that the current sensor 30 is in a normal state if the error rate ε falls within a normal range. In addition, the processor 300 may diagnose that the current sensor 30 is in an abnormal state if the error rate (ε) does not fall within the normal range.

Here, the normal range is a preset reference range, and the processor 300 may diagnose the state of the current sensor 30 based on whether the error rate (ε), which is a difference between the calculated change value of the voltage-based charged charge amount and the calculated change value of the current-based charged charge amount, falls within the normal range.

The normal range may be increased or decreased based on the temperature of the cell assembly 10 measured during the time when the current is measured.

The processor 300 according to an embodiment of the present disclosure may calculate the change value of the voltage-based charged charge amount by comparing a charged charge amount corresponding to a measured voltage of the cell assembly 10 at a charging initiation time and a charged charge amount corresponding to a measured voltage of the cell assembly 10 at charging completion time.

$$\Delta SOC(V) = SOC(t1) - SOC(t0) \qquad \langle \text{Equation 2} \rangle$$

Here, ΔSOC(V) represents the change value of the voltage-based charged charge amount, t0 represents the charging initiation time point, t1 represents the charging completion time point, SOC(t0) represents the charged charge amount cell corresponding to the measured voltage of the assembly 10 measured at the charging initiation time point t0, and SOC(t1) represents the charged charge amount corresponding to the measured voltage of the cell assembly 10 measured at the charging completion time point t1.

Also preferably, the processor 300 according to an embodiment of the present disclosure may calculate the change value of the current-based charged charge amount by integrating the measured current of the cell assembly 10 from the charging initiation time point t0 to the charging completion time point t1.

Meanwhile, the processor 300 may calculate the change value of the voltage-based charged charge amount by comparing the charged charge amount corresponding to the measured voltage and the measured temperature of the cell assembly 10 at the charging initiation time and the charged charge amount corresponding to the measured voltage and the measured temperature of the cell assembly 10 at the charging completion time. In this case, SOC(t0) of Equation 2 represents the charged charge amount corresponding to the measured voltage and the measured temperature of the cell assembly 10 measured at the charging initiation time point t0, and SOC(t1) represents the charged charge amount corresponding to the measured voltage and the measured temperature of the cell assembly 10 measured at the charging completion time point t1.

$$\Delta SOC(I) = \int_{t0}^{t1} I\, dt \qquad \langle \text{Equation 3} \rangle$$

Here, ΔSOC(I) represents the change value of the current-based charged charge amount, t0 represents the charging initiation time point, t1 represents the charging completion time point, and I represents the measured current.

For example, as shown in FIG. 2, the charging device 50 may be electrically connected to a positive electrode terminal of the battery pack and a negative electrode terminal of a battery pack so that the cell assembly 10 is charged by the charging device 50. In this case, the processor 300 may calculate the change value of the current-based charged charge amount by integrating the measured current of the cell assembly 10 from the charging initiation time point t0 to the charging completion time point t1.

In addition, the processor 300 may calculate the error rate (ε) by putting the change value (ΔSOC(V)) of the voltage-based charged charge amount calculated through Equation 2 and the change value (ΔSOC(I)) of the current-based charged charge amount calculated through Equation 3 into Equation 1.

The processor 300 may diagnose the state of the current sensor 30 based on whether the calculated error rate (ε) falls within the normal range.

Preferably, the processor 300 according to an embodiment of the present disclosure may be electrically connected to a superordinate control device 70 to exchange an electric signal with the superordinate control device 70 as shown in FIG. 2. For example, the processor 300 may transmit the diagnostic result of the current sensor 30 to the superordinate control device 70. More specifically, the processor 300 may transmit an alarm to the superordinate control device 70 if the current sensor 30 is in an abnormal state.

Meanwhile, the processor 300 may be implemented to optionally include a processor 300, an application-specific integrated circuit (ASIC), another chipset, a logic circuit, a register, a communication modem and/or a data processing device, which are known in the art, to perform the above operations.

Meanwhile, the memory device 400 is not particularly limited as long as it is a storage medium capable of recording and erasing data. For example, the memory device 400 may be a RAM, a ROM, a register, a hard disk, an optical recording medium or a magnetic recording medium. The memory device 400 may also be electrically connected to the processor 300 through, for example, a data bus so as to be accessible by the processor 300. Also, the memory device 400 may store and/or update and/or erase and/or transmit a program including various control logics executed by the processor 300 and/or data generated when the control logic is executed.

Figure 3:
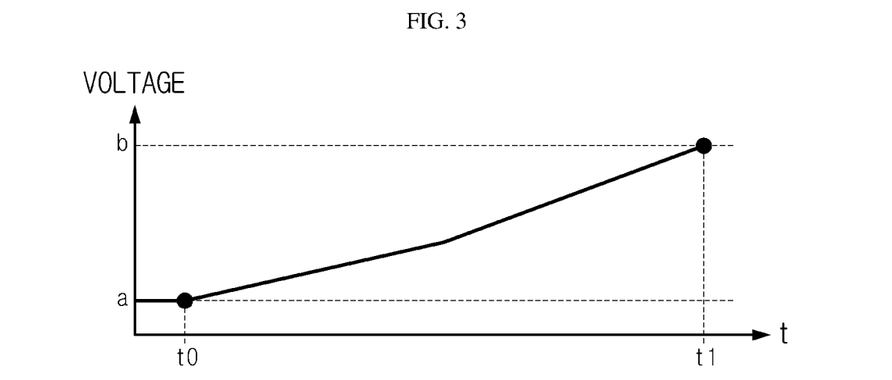
FIG. 3 shows a measured voltage referenced by a processor according to an embodiment of the present disclosure.
Figure 4:
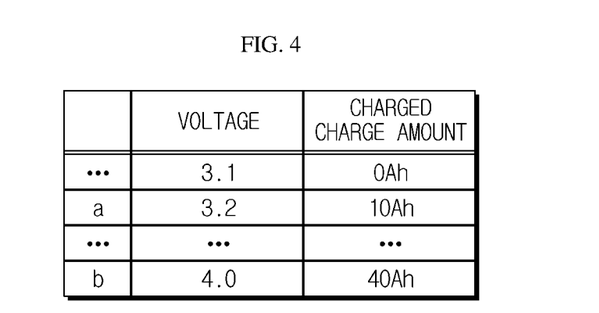
FIG. 4 shows a voltage-charged charge amount look-up table reference by the processor according to an embodiment of the present disclosure.

FIG. 3 shows a measured voltage referenced by the processor according to an embodiment of the present disclosure, and FIG. 4 shows a voltage-charged charge amount look-up table reference by the processor according to an embodiment of the present disclosure. In FIGS. 3 and 4, the unit of voltage is [V], the unit of time (t) is [h], and the unit of charged charge amount is [Ah].

Referring to FIGS. 3 and 4, the processor 300 according to an embodiment of the present disclosure may calculate the change value of the voltage-based charged charge amount based on the measured voltage received with a time difference during the preset reference time. More specifically, the processor 300 may receive the measured voltage with a time difference from the voltage measuring unit 100. Here, the time difference may be a difference of the preset reference times.

For example, if the preset reference times are t0 and t1, the processor 300 may receive the measured voltage a [V] measured at t0 from the voltage measuring unit 100 as shown in the graph of FIG. 3. In addition, the processor 300 may receive the measured voltage b [V] measured at t1 from the voltage measuring unit 100.

In addition, as shown in the table of FIG. 4, the processor 300 may calculate that the change value of the voltage-based charged charge amount is 30 [Ah], based on the charged charge amount 10 [Ah] corresponding to the measured voltage 3.2 [V] measured at t0 and the charged charge amount 40 [Ah] corresponding to the measured voltage 4.0 [V] measured at t1.

Also, the processor 300 may calculate the change value of the current-based charged charge amount by integrating the current amount flowing in the cell assembly 10 during the period of t0 to t1. In this case, the processor 300 may calculate the change value of the current-based charged charge amount by using Equation 3 described above.

For example, as in the former embodiment, it is assumed that at the preset reference times t0 and t1, the change value of the voltage-based charged charge amount calculated by the processor 300 is 30 [Ah]. Also, it is assumed that the change value of the current-based charged charge amount calculated by the processor 300 during the period of t0 to t1 using Equation 3 is 27 [Ah]. In this case, if the change value (30 [Ah]) of the voltage-based charged charge amount and the change value (27 [Ah]) of the current-based charged charge amount are put into Equation 1, the error rate ($\varepsilon$) may be calculated as 10[%]. Here, if the normal range is set to −5[%] to +5[%], the calculated error rate ($\varepsilon$) does not fall within the normal range, and thus the processor 300 may determine that the current sensor 30 is in an abnormal state.

As another example, it is assumed that the change value of the voltage-based charged charge amount calculated by the processor 300 at the preset reference times t0 and t1 is 30 [Ah] as in the former example. In addition, it is assumed that the change value of the current-based charged charge amount calculated by the processor 300 during the period of t0 to t1 using Equation 3 is 29 [Ah]. In this case, if the change value (30 [Ah]) of the voltage-based charged charge amount and the change value (29 [Ah]) of the current-based charged charge amount are put into Equation 1, the error rate ($\varepsilon$) may be calculated as 3.3[%]. As in the former embodiment, when the normal range is set as −5[%] to +5[%], the calculated error rate ($\varepsilon$) falls within the normal range, and thus the processor 300 may determine that the current sensor 30 is in a normal state.

Meanwhile, the processor 300 may estimate the voltage-based charged charge amount based on the measured voltage and the measured temperature of the cell assembly 10.

Specifically, the processor 300 may estimate the voltage-based charged charge amounts corresponding to the measured voltage and the measured temperature of the cell assembly 10 by using the look-up table defining charged charge amounts corresponding to voltages and temperatures, which is stored in the memory device 400. That is, the processor 300 may estimate the voltage-based charged charge amounts according to the voltages and the temperatures of the cell assembly 10 measured at two or more preset reference times and calculate the change value of the voltage-based charged charge amount by computing the difference between the estimated voltage-based charged charge amounts.

For example, it is assumed that the preset reference times are t0 and t1, respectively. The voltage measuring unit 100 may measure the voltage of the cell assembly 10 at t0 and t1, respectively. Similarly, the temperature measuring unit 500 may also measure the temperature of the cell assembly 10 at t0 and t1, respectively. The processor 300 may estimate the voltage-based charged charge amount according to the voltage and the temperature of the cell assembly 10 measured at t0 by using the look-up table stored in the memory device 400. In addition, the processor 300 may estimate the voltage-based charged charge amount according to the voltage and the temperature of the cell assembly 10 measured at t1 by using the look-up table stored in the memory device 400. Also, the processor 300 may calculate a change value of the voltage-based charged charge amount by calculating a difference between the voltage-based charged charge amount at t0 and the voltage-based charged charge amount at t1.

Specifically, in the embodiment of FIGS. 3 and 4, the processor 300 may estimate the measured voltage 3.2 [V] of the cell assembly 10 measured at t0 and the charged voltage amount 10 [Ah] corresponding to the measured temperature. In addition, the processor 300 may estimate the measured voltage 4.0 [V] of the cell assembly 10 measured at t1 and the charged voltage amount 40 [Ah] corresponding to the measured temperature. Also, the processor 300 may calculate that the change value of the voltage-based charged charge amount is 30 [Ah], based on the estimated charge amount (10 [Ah]) at t0 and the charged charge amount (40 [Ah]) at t1.

In addition, the processor 300 may set the normal range in consideration of the temperature of the cell assembly 10.

In other words, the processor 300 may accurately diagnose the state of the current sensor based on the difference between the change value of the voltage-based charged charge amount and the change value of the current-based charged charge amount by increasing or decreasing the normal range according to the temperature of the cell assembly 10.

Preferably, the processor 300 may change the normal range according to the difference between the temperatures of the cell assembly 10 measured at the preset reference times. That is, the normal range may be changed according to the temperatures of the cell assembly 10 measured at the preset reference times.

As described above, the charged charge amount of the cell assembly 10 may be estimated based on the temperature and the voltage of the cell assembly 10. In addition, since the temperatures of the cell assembly 10 measured at the preset reference times may be different from each other, the change value of the voltage-based charged charge amount may be changed according to the temperature of the cell assembly 10. Accordingly, the processor 300 may change the size of the normal range according to the measured temperature of the cell assembly 10 in order to correct that the change value of the voltage-based charged charge amount is changed according to the temperature. This will be described in detail with reference to Table 1.

For example, the memory device 400 may store a reference table as shown in Table 1 below.

TABLE 1

| SOC [%] | Temperature (° C.) | | | | |
|---|---|---|---|---|---|
| | −20 | −10 | 0 | 25 | 35 |
| ... | | | | | |
| 80 | 3.989 | 3.995 | 4.005 | 4.006 | 4.012 |
| 78 | 3.968 | 3.976 | 3.985 | 3.985 | 3.991 |
| 76 | 3.95 | 3.956 | 3.965 | 3.964 | 3.97 |
| 74 | 3.932 | 3.937 | 3.945 | 3.944 | 3.95 |
| ... | | | | | |

Table 1 is a look-up table in which voltages according to SOCs and temperatures of the battery cells are mapped, the look-up table being stored in the memory device 400 according to an embodiment of the present disclosure. That is, Table 1 is a result of measuring the voltage of the cell assembly 10 by varying the SOC (%) in the temperature range (−20[° C.] to 35[° C.]) within which the battery cell is generally used. Here, the cell assembly 10 may be configured to include one battery cell.

For example, seeing Table 1, when the temperature of the cell assembly 10 is 35[° C.] and the voltage is 3.97 [V], the processor 300 may estimate that the SOC of the cell assembly 10 is 76[%]. In addition, when the temperature of the cell assembly 10 is −20[° C.] and the voltage is 3.968 [V], the processor 300 may estimate that the SOC of the cell assembly 10 is 78%.

That is, although the voltage of the cell assembly 10 is the same at both time points, the processor 300 may estimate that the SOC of the cell assembly 10 is lower as the temperature of the cell assembly 10 rises. In other words, although the voltage of the cell assembly 10 is the same at both time points, the processor 300 may estimate that the SOC of the cell assembly 10 is higher as the temperature of the cell assembly 10 is lowered.

For example, it is assumed that the preset reference times are t0 and t1, respectively. At t0, when the measured temperature of the cell assembly 10 measured by the temperature measuring unit 500 is −20[° C.] and the measured voltage of the cell assembly 10 measured by the voltage measuring unit 100 is 3.932 [V], the processor 300 may estimate that the SOC of the cell assembly 10 is 74[%] with reference to Table 1.

Further, at t1, when the measured temperature of the cell assembly 10 measured by the temperature measuring unit 500 is −20[° C.] and the measured voltage of the cell assembly 10 measured by the voltage measuring unit 100 is 3.968 [V], the processor 300 may estimate that the SOC of the cell assembly 10 is 78[%] with reference to Table 1. In this case, the difference between the SOC at t0 and the SOC at t1 of the cell assembly 10 is 4[%].

That is, when the temperature of the cell assembly 10 is the same at t0 and t1, the SOC may be estimated differently according to the measured voltage of the cell assembly 10.

Meanwhile, it is assumed that the measured temperature of the cell assembly 10 measured at t0 is −20[° C.] and the measured voltage is 3.932 [V], which is the same as the former embodiment. At t1, when the measured temperature of the cell assembly 10 measured by the temperature measuring unit 500 is 35[° C.] and the measured voltage of the cell assembly 10 measured by the voltage measuring unit 100 is 3.7 [V], the processor 300 may estimate that the SOC of the cell assembly 10 is 76[%] with reference to Table 1.

In this case, the difference between the SOC at t0 and the SOC at t1 of the cell assembly 10 is 2[%].

Referring to the former embodiment, it may be found that the difference between the SOCs when the temperature of the cell assembly 10 is −20[° C.] at t0 and t1 is greater than the difference between the SOCs when the temperature of the cell assembly 10 at −20[° C.] at t0 and the temperature of the cell assembly 10 is 35[° C.] at t1. That is, as the measured temperature of the cell assembly 10 is higher, the SOC may be lower even though the measured voltage is the same. Thus, as the difference between the measured temperatures of the cell assembly 10 measured at the preset reference times (at least two times) increases, the change value of the voltage-based charged charge amount of the cell assembly 10 may be smaller.

Accordingly, the processor 300 may change the size of the normal range according to the difference between the temperatures of the cell assembly 10 respectively measured at the preset reference times in order to correct that the change value of the voltage-based charged charge amount is changed due to the temperature.

Preferably, the processor 300 may set the size of the normal range as a reference size if the temperature of the cell assembly 10 measured at two or more preset reference times is the same. For example, the processor 300 may set the range of −5[%] to 5[%] as the reference size of the normal range. In this case, if the error rate between the change value of the voltage-based charged charge amount and the change value of the current-based charged charge amount is within the normal range, the processor 300 may diagnose that the current sensor is in a normal state.

In addition, if the measured temperature of the cell assembly 10 measured at a previous time is lower than the measured temperature of the cell assembly 10 measured at a later time, the processor 300 may reduce the size of the normal range to be smaller than the reference size. For example, if the temperature of the cell assembly 10 measured at t0 is −20[° C.] and the temperature of the cell assembly 10 measured at t1 is 35[° C.], the processor 300 may reduce the size of the normal range to be smaller than the reference size.

On the contrary, if the measured temperature of the cell assembly 10 measured at a previous time is higher than the measured temperature of the cell assembly 10 measured at a later time, the processor 300 may increase the size of the normal range to be greater than the reference size. For example, if the temperature of the cell assembly 10 measured at t0 is 35[° C.] and the temperature of the cell assembly 10 measured at t1 is −20[° C.], the processor 300 may increase the size of the normal range to be greater than the reference size.

That is, the processor 300 may increase the size of the normal range if the measured temperature of the cell assembly 10 measured at a completion time (for example, t1) is lower than the measured temperature of the cell assembly 10 measured at an initiation time (for example, t0). On the contrary, the processor 300 may reduce the size of the normal range if the measured temperature of the cell assembly 10 measured at the completion time (for example, t1) is higher than the measured temperature of the cell assembly 10 measured at the initiation time (for example, t0).

Thus, the apparatus for diagnosing a current sensor according to an embodiment of the present disclosure may diagnose the state of the current sensor more accurately since it changes the normal range based on the temperature of the cell assembly 10 even when the temperature of the cell assembly 10 changes, while the cell assembly 10 is being charged or discharged.

The current sensor diagnosing apparatus according to the present disclosure may be applied to a battery management system (BMS). That is, the BMS according to the present disclosure may include the current sensor diagnosing apparatus of the present disclosure as described above. In this configuration, at least a part of the components of the current sensor diagnostic apparatus according to the present disclosure may be implemented by supplementing or adding functionality of components included in the conventional BMS. For example, the processor 300 and the memory device 400 of the current sensor diagnosing apparatus according to the present disclosure may be implemented as components of the BMS.

In addition, the current sensor diagnosis apparatus according to the present disclosure may be provided to a battery pack. That is, the battery pack according to the present disclosure may include the current sensor diagnosing apparatus of the present disclosure as described above. Here, the battery pack may include at least one secondary battery, the current sensor diagnosing apparatus, electrical components (including a BMS, a relay, a fuse, and the like), and a case.

Figure 5:
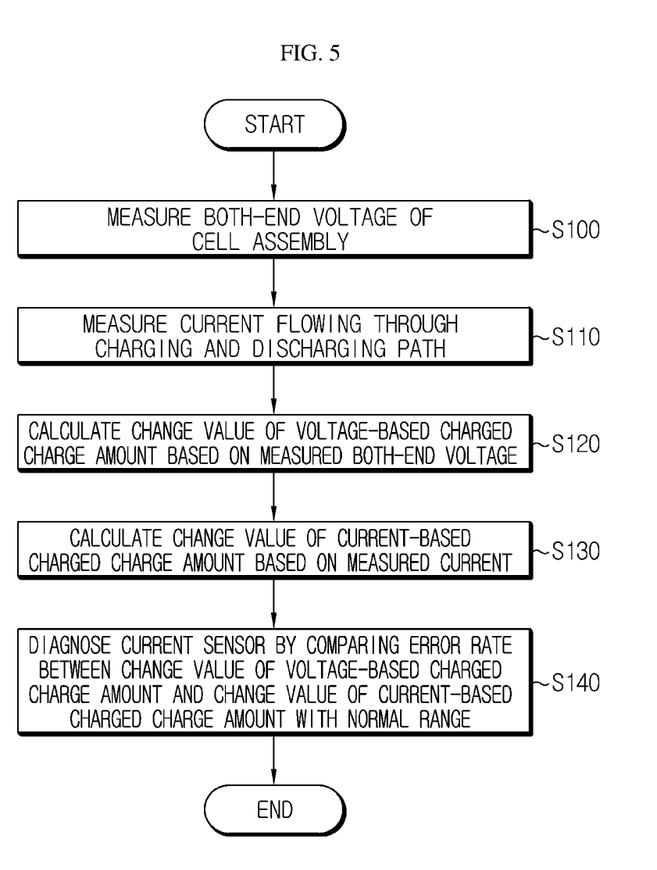
FIG. 5 is a schematic flowchart for illustrating a method for diagnosing a current sensor according to another embodiment of the present disclosure.

FIG. 5 is a schematic flowchart for illustrating a method for diagnosing a current sensor according to another embodiment of the present disclosure. In FIG. 5, each step may be performed by any component of the apparatus for diagnosing a current sensor according to the present disclosure as described above.

As shown in FIG. 5, the method for diagnosing a current sensor according to the present disclosure includes a voltage measuring step (S100), a current measuring step (S110), a step of calculating the change value of the voltage-based charged charge amount (S120), a step of calculating the change value of the current-based charged charge amount (S130) and a current sensor diagnosing step (S140).

The voltage measuring step (S100) is a step of measuring a both-end voltage of the cell assembly 10. That is, in the voltage measuring step (S100), the both-end voltage of the cell assembly 10 may be measured at each preset reference time. For example, seeing the embodiment of FIG. 3, in the voltage measuring step (S100), the both-end voltage of the cell assembly 10 may be measured at t0 and t1, respectively.

The current measuring step (S110) is a step of measuring a current flowing through the charging and discharging path. Here, the charging and discharging path is a large current path along to which the cell assembly 10 is connected, and a current sensor to be diagnosed may be installed at the charging and discharging path. That is, in the current measuring step (S110), the current flowing through the charging and discharging path equipped with the current sensor may be measured during the preset reference time. For example, seeing the embodiment FIG. 3, in the current measuring step (S110), the current flowing through the charging and discharging path may be measured during t0 to t1, respectively.

The step of calculating the change value of the voltage-based charged charge amount (S120) is a step of calculating a change value of the voltage-based charged charge amount based on the both-end voltages of the cell assembly 10 respectively measured at the preset reference times.

Preferably, in the step of calculating the change value of the voltage-based charged charge amount (S120), the change value of the voltage-based charged charge amount may be calculated by comparing the charged charge amount corresponding to the measured voltage of the cell assembly at the charging initiation time and the charged charge amount corresponding to the measured voltage of the cell assembly at the charging completion time.

For example, seeing the embodiment of FIG. 3, the voltage-based charged charge amount at t0 may be estimated based on the both-end voltage of the cell assembly 10 measured at t0. In addition, the voltage-based charged charge amount at t1 may be estimated based on the both-end voltage of the cell assembly 10 measured at t1. Also, the change value of the voltage-based charged charge amount may be calculated according to the difference between the estimated voltage-based charged charge amount at t0 and the estimated voltage-based charged charge amount at t1.

The step of calculating the change value of the current-based charged charge amount (S130) is a step of calculating a change value of the current-based charged charge amount based on the current measured during the preset reference time.

Preferably, in the step of calculating the change value of the current-based charged charge amount (S130), the change value of the current-based charged charge amount may be calculated based on the current accumulated during the preset reference time.

For example, seeing the embodiment of FIG. 3, the change value of the current-based charged charge amount may be calculated based on the current amount accumulated during the period of t0 to t1.

The current sensor diagnosing step (S140) is a step of diagnosing the current sensor by comparing an error rate between the calculated change value of the voltage-based charged charge amount and the calculated change value of the current-based charged charge amount with the normal range.

First, in the current sensor diagnosing step (S140), an error rate between the change value of the voltage-based charged charge amount and the change value of the current-based charged charge amount may be calculated.

In addition, in the current sensor diagnosing step (S140), the state of the current sensor may be diagnosed according to whether the calculated error rate belongs to the normal range.

For example, if the calculated error rate falls within the normal range, it may be diagnosed that the current sensor is in a normal state. On the contrary, if the calculated error rate does not fall with the normal range, it may be diagnosed that the current sensor is in an abnormal state.

Figure 6:
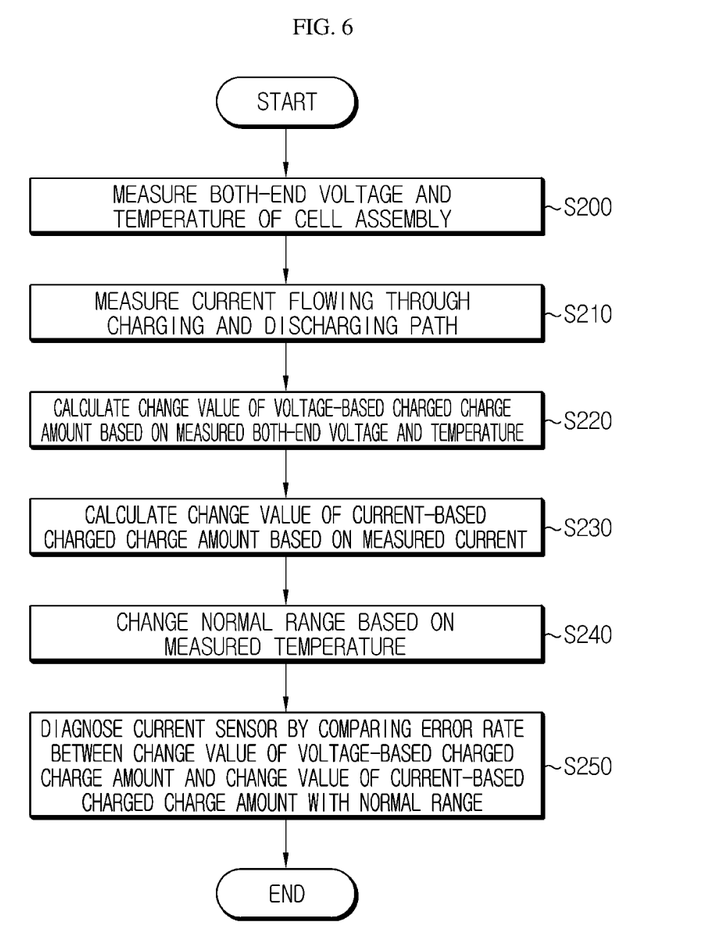
FIG. 6 is a schematic flowchart for illustrating a method for diagnosing a current sensor according to still another embodiment of the present disclosure.

FIG. 6 is a schematic flowchart for illustrating a method for diagnosing a current sensor according to still another embodiment of the present disclosure. In FIG. 6, each step may be performed by any component of the current sensor diagnosing apparatus according to the present disclosure as described above.

Referring to FIG. 6, the method for diagnosing a current sensor according to still another embodiment of the present disclosure may include a voltage and temperature measuring step (S200), a current measuring step (S210), a step of calculating the change value of the voltage-based charged charge amount (S220), a step of calculating the change value of the current-based charged charge amount (S230), a normal range changing step (S240) and a current sensor diagnosing step (S250).

The voltage and temperature measuring step (S200) is a step of measuring a both-end voltage and a temperature of the cell assembly 10. That is, the voltage and temperature measuring step (S200) further measures the temperature of the cell assembly, compared to the voltage measuring step (S100) of FIG. 5.

For example, seeing the embodiment of FIG. 3, in the voltage and temperature measuring step (S200), the both-end voltage and the temperature of the cell assembly 10 may be measured at t0 and t1, respectively.

The current measuring step (S210) is a step of measuring a current flowing through the charging and discharging path. That is, the current measuring step (S210) is the same step as the current measuring step (S110) of FIG. 5, and the current flowing through the charging and discharging path equipped with the current sensor may be measured during the preset reference time. For example, seeing the embodiment of FIG. 3, in the current measuring step (S210), the current flowing through the charging and discharging path during the period of t0 to t1 may be measured.

The step of calculating the change value of the voltage-based charged charge amount (S220) is a step of calculating the change value of the voltage-based charged charge amount based on the both-end voltage and the temperature of the cell assembly 10 measured at each preset reference time.

That is, in the step of calculating the change value of the voltage-based charged charge amount (S220), the change value of the voltage-based charged charge amount may be calculated based on the both-end voltage and the temperature of the cell assembly 10, unlike the step of calculating the change value of the voltage-based charged charge amount (S120) of FIG. 5.

For example, seeing the embodiment of FIG. 3, the voltage-based charged charge amount at t0 may be estimated based on the both-end voltage and the temperature of the cell assembly 10 measured at t0. In addition, the voltage-based charged charge amount at t1 may be estimated based on the both-end voltage and the temperature of the cell assembly 10 measured at t1. Also, the change value of the voltage-based charged charge amount may be calculated according to the difference between the estimated voltage-based charged charge amount at t0 and the estimated voltage-based charged charge amount at t1.

Specifically, in step of calculating the change value of the voltage-based charged charge amount (S220), when the voltage-based charged charge amount is estimated based on the both-end voltage and the temperature of the cell assembly 10, the look-up table stored in the memory device 400 may be used. Here, the look-up table stored in the memory device 400 may be a table in which charged charge amounts corresponding to both-end voltages and temperatures are defined.

The step of calculating the change value of the current-based charged charge amount (S230) is a step of calculating the change value of the current-based charged charge amount based on the current measured during the preset reference time.

That is, the step of calculating the change value of the current-based charged charge amount (S230) as shown in FIG. 6 is the same step as the step of calculating the change value of the current-based charged charge amount (S130) as shown in FIG. 5, and the change value of the current-based charged charge amount may be calculated based on the current accumulated during the preset reference time.

The normal range changing step (S240) is a step of changing the normal range based on the measured temperature, and the normal range may be changed according to the temperatures of the cell assembly 10 measured at the preset reference times, respectively.

For example, seeing the embodiment of FIG. 3, if the temperature of the cell assembly 10 measured at t0 and the temperature of the cell assembly 10 measured at t1 are different, the normal range may be changed.

Here, the normal range is a preset range and may be a reference range within which the processor 300 may diagnose that the current sensor 30 is in a normal state.

Preferably, the normal range may be set to have a reference size if the temperatures of the cell assembly 10 measured at two or more preset reference times are the same. For example, the normal range may be set to be −5[%] to 5[%]. Here, the range of −5[%] to 5[%] may be the reference size.

If the measured temperature of the cell assembly 10 measured at a previous time is lower than the measured temperature of the cell assembly 10 measured at a later time, the size of the normal range may be reduced compared to the reference size. For example, if the temperature of the cell assembly 10 measured at t0 is −20[° C.] and the temperature of the cell assembly 10 measured at t1 is 35[° C.], since the temperature of the cell assembly 10 measured at t0 is lower than the temperature of assembly 10 measured at t1, the size of the normal range may be reduced to be smaller than the reference size.

On the contrary, if the measured temperature of the cell assembly 10 measured at the previous time is higher than the measured temperature of the cell assembly 10 measured at the later time, the size of the normal range may be increased compared to the reference size. For example, if the temperature of the cell assembly 10 measured at t0 is 35[° C.] and the temperature of the cell assembly 10 measured at t1 is −20[° C.], the size of the normal range may be increased to be greater than the reference size.

The current sensor diagnosing step (S250) is a step of diagnosing the current sensor by comparing an error rate between the calculated change value of the voltage-based charged charge amount and the calculated change value of the current-based charged charge amount with the normal range. That is, the current sensor diagnosing step (S250) is a step of diagnosing the state of the current sensor depending on whether the error rate between the calculated change value of the voltage-based charged charge amount and the calculated change value of the current-based charged charge amount falls within the normal range set in the normal range changing step (S240).

In the current sensor diagnosing step (S250) of FIG. 6, if the calculated error rate falls within the normal range, the current sensor may be diagnosed as being in the normal state, like the current sensor diagnosing step (S140) of FIG. 5. In addition, if the calculated error rate does not fall within the normal range, the current sensor may be diagnosed as being in an abnormal state.

That is, according to still another embodiment of the present disclosure, since the normal range may be changed according to the temperature of the cell assembly 10, the state of the current sensor may be diagnosed more accurately according to the temperature change of the cell assembly 10.

Also, when the control logic according to an embodiment of the present disclosure is implemented in software, the processor may be implemented as a set of program modules. At this time, the program modules may be stored in a memory device and executed by a processor.

In addition, there is no particular limitation on the types of various control logics of the processor, as long as one or more control logics are combined and the combined control logic is written in a computer-readable code system so that the computer-readable access is possible. As one example, the recording medium includes at least one selected from the group consisting of a ROM, a RAM, a register, a CD-ROM, a magnetic tape, a hard disk, a floppy disk and an optical data recording device. In addition, the code system may be stored and executed in a distributed manner on computers connected through a network. Moreover, functional programs, code and segments for implementing the combined control logics may be easily inferred by programmers in the technical field to which the present disclosure belongs.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

REFERENCE SIGN

1: apparatus for diagnosing a current sensor.
10: cell assembly
30: current sensor
50: charging device
70: superordinate control device
100: voltage measuring unit
200: current measuring unit
300: processor
400: memory device
500: temperature measuring unit

What is claimed is:

1. An apparatus for diagnosing a current sensor provided on a charging and discharging path for supplying a charging and discharging current to a cell assembly, the apparatus comprising:
    a voltage measuring unit electrically connected to the cell assembly to measure a voltage across both ends of the cell assembly;
    a current measuring unit electrically connected to the current sensor to receive an electric signal from the current sensor and measure a current flowing through the charging and discharging path based on the electric signal;
    a temperature measuring unit electrically connected to the cell assembly and configured to measure a temperature of the cell assembly at each of the at least two preset reference times; and
    a processor configured to calculate a voltage-based amount of change in charge to the cell assembly based on the measured voltage at each of at least two preset reference times by the voltage measuring unit and the measured temperature of the cell assembly at each of the at least two preset reference times by the temperature measuring unit, calculate a current-based amount of change in charge to the cell assembly based on the measured current at the at least two preset reference times by the current measuring unit, and diagnose the current sensor based on the voltage-based amount of change in charge to the cell assembly and the current-based amount of change in charge to the cell assembly.

2. The apparatus for diagnosing a current sensor according to claim 1,
    wherein the processor is configured to compare the voltage-based amount of change in charge to the cell assembly and the current-based amount of change in charge to the cell assembly, and diagnose that the current sensor is in a normal state when a difference between the voltage-based amount of change in charge to the cell assembly and the current-based amount of change in charge to the cell assembly is within a normal range.

3. The apparatus for diagnosing a current sensor according to claim 2,
    wherein the processor is configured to change the normal range according to a difference between the measured temperatures of the cell assembly measured at each of the at least two preset reference times and diagnose that the current sensor is in the normal state when the difference between the voltage-based amount of change in charge to the cell assembly and the current-based amount of change in charge to the cell assembly is within the changed normal range.

4. The apparatus for diagnosing a current sensor according to claim 1,
    wherein the at least two preset reference times include a charging initiation time and a charging completion time, and
    wherein the processor is configured to calculate the voltage-based amount of change in charge to the cell assembly by comparing a first amount of charge in the cell assembly corresponding to the measured voltage of the cell assembly at the charging initiation time to a second amount of charge in the cell assembly corresponding to a measured voltage of the cell assembly at the charging completion time.

5. The apparatus for diagnosing a current sensor according to claim 1,
    wherein the at least two preset reference times include a charging initiation time and a charging completion time, and
    wherein the processor is configured to calculate the current-based amount of change in charge to the cell assembly by accumulating the measured current of the cell assembly from the charging initiation time to the charging completion time.

6. The apparatus for diagnosing a current sensor according to claim 1, further comprising:
    a memory device configured to store a look-up table, which predefines an amount of charge to the cell assembly corresponding to either (i) the voltage across both ends of the cell assembly or (ii) a combination of both the voltage across both ends of the cell assembly and a temperature of the cell assembly.

7. A battery management system (BMS), comprising the apparatus for diagnosing a current sensor according to claim 1.

8. A battery pack, comprising the apparatus for diagnosing a current sensor according to claim 1.

9. A method for diagnosing a current sensor provided on a charging and discharging path for supplying a charging and discharging current to a cell assembly, the method comprising:
    measuring a voltage across both ends of the cell assembly at each of at least two preset reference times;
    measuring a current flowing through the charging and discharging path, on which the current sensor is provided, during each of the at least two preset reference times;
    measuring a temperature of the cell assembly during each of the at least two preset reference times;
    calculating a voltage-based amount of change in charge to the cell assembly based on the measured voltage of the cell assembly at each of the at least two preset reference times and the measured temperature of the cell assembly at each of the at least two preset reference times;

calculating a current-based amount of change in charge to the cell assembly based on the measured current accumulatively at each of the at least two preset reference times; and diagnosing the current sensor based on the voltage-based amount of change in charge to the cell assembly and the current-based amount of change in charge to the cell assembly.

10. The method for diagnosing a current sensor according to claim 9, wherein diagnosing the current sensor includes:

comparing the voltage-based amount of change in charge to the cell assembly and the current-based amount of change in charge to the cell assembly, and determining that the current sensor is in a normal state when a difference between the voltage-based amount of change in charge to the cell assembly and the current-based amount of change in charge to the cell assembly is within a normal range.

11. The method for diagnosing a current sensor according to claim 10, wherein the method further comprises changing the normal range according to a difference between the measured temperatures of the cell assembly measured at each of the at least two preset reference times, and wherein diagnose the current sensor includes diagnosing that the current sensor is in the normal state when the difference between the voltage-based amount of change in charge to the cell assembly and the current-based amount of change in charge to the cell assembly is within the changed normal range.

12. The method for diagnosing a current sensor according to claim 9, wherein the at least two preset reference times include a charging initiation time and a charging completion time, and wherein diagnosing the current sensor includes calculating the voltage-based amount of change in charge to the cell assembly by comparing a first amount of charge in the cell assembly corresponding to the measured voltage of the cell assembly at the charging initiation time to a second amount of charge in the cell assembly corresponding to the measured voltage of the cell assembly at the charging completion time.

13. The method for diagnosing a current sensor according to claim 9, wherein the at least two preset reference times include a charging initiation time and a charging completion time, and wherein diagnosing the current sensor includes calculating the current-based amount of change in charge to the cell assembly by accumulating the measured current of the cell assembly from the charging initiation time to the charging completion time.

* * * * *